United States Patent
Huang

(10) Patent No.: US 11,309,401 B2
(45) Date of Patent: Apr. 19, 2022

(54) METHOD FOR MANUFACTURING THIN FILM TRANSISTOR AND THIN FILM TRANSISTOR

(71) Applicant: Wuhan China Star Optoelectronics Semiconductor Display Technology Co., Ltd., Hubei (CN)

(72) Inventor: Tianyu Huang, Hubei (CN)

(73) Assignee: Wuhan China Star Optoelectronics Semiconductor Display Technology Co., Ltd., Hubei (CN)

(*) Notice: Subject to any disclaimer, the term of this patent is extended or adjusted under 35 U.S.C. 154(b) by 260 days.

(21) Appl. No.: 16/604,262

(22) PCT Filed: Apr. 1, 2019

(86) PCT No.: PCT/CN2019/080720
§ 371 (c)(1),
(2) Date: Oct. 10, 2019

(87) PCT Pub. No.: WO2020/124858
PCT Pub. Date: Jun. 25, 2020

(65) Prior Publication Data
US 2021/0328040 A1     Oct. 21, 2021

(30) Foreign Application Priority Data
Dec. 19, 2018  (CN) .......................... 201811552695.9

(51) Int. Cl.
*H01L 29/66* (2006.01)
*H01L 21/265* (2006.01)
(Continued)

(52) U.S. Cl.
CPC .. *H01L 29/66446* (2013.01); *H01L 21/26546* (2013.01); *H01L 29/04* (2013.01); *H01L 29/2003* (2013.01); *H01L 29/78681* (2013.01)

(58) Field of Classification Search
CPC ......... H01L 29/66446; H01L 29/78681; H01L 29/04; H01L 21/26546; H01L 29/2003
See application file for complete search history.

(56) References Cited

U.S. PATENT DOCUMENTS

| 5,132,749 A | 7/1992 | Nishibayashi et al. |
| 2012/0133351 A1 | 5/2012 | Tsuno et al. |

(Continued)

FOREIGN PATENT DOCUMENTS

| CN | 104282696 A | 1/2015 |
| CN | 104538306 A | 4/2015 |
| CN | 107533981 A | 1/2018 |

OTHER PUBLICATIONS

Bello et al., "Deposition of thick cubic boron nitride films: The route to practical applications"—2005; Diamond & Related Materials 14 (2005) 1154-1162. (Year: 2005).*

(Continued)

*Primary Examiner* — Syed I Gheyas
(74) *Attorney, Agent, or Firm* — Taft Stettinius & Hollister LLP

(57) ABSTRACT

The present disclosure provides a method for manufacturing a thin film transistor and a thin film transistor, which includes providing a substrate; forming an active layer on the substrate and patterning the active layer, the active layer is made of cubic boron nitride; and forming a first insulating layer, a gate electrode metal layer, a second insulating layer, a source and drain metal layer and a flat layer on the active layer successively. the method for manufacturing a thin film transistor and the thin film transistor of the present disclosure employ cubic boron nitride instead of polysilicon as active layer materials, CVD process is directly applied to form the active layer with cubic boron nitride.

12 Claims, 3 Drawing Sheets

(51) Int. Cl.
*H01L 29/04* (2006.01)
*H01L 29/20* (2006.01)
*H01L 29/786* (2006.01)

(56) References Cited

U.S. PATENT DOCUMENTS

2016/0260840 A1  9/2016  Xie
2018/0122955 A1* 5/2018  Aichi ................ H01L 27/1222

OTHER PUBLICATIONS

Konyashin et al.; "Plasma-Assisted CVD of Cubic Boron Nitride"—1997; Chem. Vap. Deposition (1997) 239-255. (Year: 1997).*

* cited by examiner

METHOD FOR MANUFACTURING THIN FILM TRANSISTOR AND THIN FILM TRANSISTOR

CROSS-REFERENCE TO RELATED APPLICATIONS

This application is a U.S. National Phase of International PCT Application No. PCT/CN2019/080720 filed Apr. 1, 2019, which claims the benefit of Chinese Patent Application Serial No. 201811552695.9 filed Dec. 19, 2018, the contents of each application are incorporated herein by reference in their entirety.

BACKGROUND OF INVENTION

Field of Invention

The present invention relates to a thin film transistor technology, and particularly to a method for manufacturing a thin film transistor and a thin film transistor.

Description of Prior Art

In manufacturing a thin film transistor of a display panel, it includes a step of forming an active layer. At present, low temperature poly-silicon (LTPS) is used as a channel of a thin film transistor. In the manufacturing process, first an amorphous silicon is deposited by plasma enhanced chemical vapor deposition, then a dehydrogenating process is applied to the amorphous silicon, a laser annealing process is applied, and finally an ion implantation and hydrogenation process is applied. However, in the manufacturing process of forming the active layer formation, the process steps are relatively complex.

Therefore, it is necessary to provide a thin film transistor and a method for manufacturing the thin film transistor with a simplified process to solve the above technical problems.

SUMMARY OF INVENTION

The application mainly provides to a method for manufacturing a thin film transistor and a thin film transistor to solve the above technical problems that the manufacturing process of the thin film transistor is more complex in prior art.

The present disclosure provides a method for manufacturing a thin film transistor, includes:
  providing a substrate;
  forming an active layer on the substrate and patterning the active layer, wherein the active layer is made of cubic boron nitride;
  forming a first insulating layer upon the substrate;
  forming a gate electrode metal layer upon the substrate;
  forming a second insulating layer upon the substrate; and
  forming a source and drain metal layer upon the substrate;
  wherein during the step of forming an active layer on the substrate, the active layer is formed by a chemical vapor deposition method, vapor for forming the active layer include boron chloride, boron hydride, and ammonia;
  wherein the step of forming an active layer on the substrate includes:
    coating a photoresist on the active layer;
    exposing and developing the photoresist by a mask process to form an exposing region to expose the active layer;
    etching the active layer disposed in the exposing region to form a patterned active layer; and
    removing a remaining part of the photoresist.

In the method for manufacturing a thin film transistor of the present disclosure, the patterned active layer includes a channel region and a doped region disposed at two sides of the channel region, the method for manufacturing the thin film transistor includes applying a doping process to the active layer, and the step of applying a doping process to the active layer includes:
  applying a first doping treatment to the doping region;
  forming the first insulating layer on the patterned active layer;
  forming through holes in the first insulating layer corresponding to the doping region to expose at least a part of the doping region; and
  applying a second doping treatment to the doping region exposed through the through holes, and a doping amount of an element of the second doping treatment is less than one third of a doping amount of an element of the first doping treatment.

In the method for manufacturing the thin film transistor of the present disclosure, the doping region is an N type doping region, and a doping element of the doping region is made of a material selected from the group consisting of phosphorus, arsenic, and antimony.

In the method for manufacturing the thin film transistor of the present disclosure, the doping region is a P type doping region, and a doping element of the doping region is made of a material selected from the group consisting of boron and indium.

In the method for manufacturing the thin film transistor of the present disclosure, the doping process is an ion implantation process.

In the method for manufacturing the thin film transistor of the present disclosure, the source and drain metal layer is electrically connected to the doping region by the through holes.

A method for manufacturing a thin film transistor includes:
  providing a substrate;
  forming an active layer on the substrate and patterning the active layer, wherein the active layer is made of cubic boron nitride;
  forming a first insulating layer upon the substrate;
  forming a gate electrode metal layer upon the substrate;
  forming a second insulating layer upon the substrate; and
  forming a source and drain metal layer upon the substrate.

In the method for manufacturing the thin film transistor of the present disclosure, during the step of forming an active layer on the substrate, the active layer is formed by a chemical vapor deposition method, and vapor for forming the active layer comprise boron chloride ($BCl_3$), boron hydride ($B_2H_4$), and ammonia ($NH_{za}$).

In the method for manufacturing the thin film transistor of the present disclosure, the step of forming an active layer on the substrate includes:
  coating a photoresist on the active layer;
  exposing and developing the photoresist by a mask process to form an exposing region to expose the active layer;
  etching the active layer disposed in the exposing region to form a patterned active layer; and
  removing a remaining part of the photoresist.

In the method for manufacturing the thin film transistor of the present disclosure, the patterned active layer includes a channel region and a doped region disposed at two sides of the channel region, the method for manufacturing the thin film transistor includes applying a doping process to the active layer, and the step of applying a doping process to the active layer includes:

applying a first doping treatment to the doping region;

forming the first insulating layer on the patterned active layer;

forming through holes in the first insulating layer corresponding to the doping region to expose at least a part of the doping region; and applying a second doping treatment to the doping region exposed through the through holes, and a doping amount of an element of the second doping treatment is less than one third of a doping amount of an element of the first doping treatment.

In the method for manufacturing the thin film transistor of the present disclosure, the doping region is an N type doping region, and a doping element of the doping region is made of a material selected from the group consisting of phosphorus, arsenic, and antimony.

In the method for manufacturing the thin film transistor of the present disclosure, the doping region is a P type doping region, and a doping element of the doping region is made of a material selected from the group consisting of boron and indium.

In the method for manufacturing the thin film transistor of the present disclosure, the doping process is an ion implantation process.

In the method for manufacturing the thin film transistor of the present disclosure, the method for manufacturing the thin film transistor includes:

forming a gate electrode metal layer on the first insulating layer and patterning the gate electrode metal layer; and forming a second insulating layer and a source and drain metal layer on the gate electrode metal layer, and the source and drain metal layer is electrically connected to the doping region by the through holes.

The present disclosure further provides a thin film transistor, which includes:

a substrate;

an active layer formed on the substrate;

a first insulating layer formed on the active layer;

a gate electrode metal layer formed on the first insulating layer;

a second insulating layer formed on the gate electrode metal layer; and a source and drain metal layer formed on the second insulating layer;

wherein the active layer is made of cubic boron nitride.

In the thin film transistor of the present disclosure, the thin film transistor is a P type thin film transistor or an N type thin film transistor.

Compared with a thin film transistor and a method for manufacturing the thin film transistor of prior art, the method for manufacturing a thin film transistor and the thin film transistor of the present disclosure employ cubic boron nitride instead of polysilicon as active layer materials, Chemical Vapor Deposition (CVD) process is directly applied to form the active layer with cubic boron nitride to omit the processes of dehydrogenating, annealing, and hydrogenating which are applied in three manufacturing process which are employed in the polysilicon as the active material in prior art to simplify the manufacturing process of a thin film transistor, to improve the production efficiency of the thin film transistor; and to solve the technical problem that the thin film transistor has complex manufacturing process of prior art.

BRIEF DESCRIPTION OF DRAWINGS

In order to more clearly illustrate the embodiments of the present application or the technical solutions in prior art, the drawings used in the embodiments will be briefly described below. The drawings in the following description are only partial embodiments of the present application, and those skilled in the art can obtain other drawings according to the drawings without any creative work.

DETAILED DESCRIPTION OF PREFERRED EMBODIMENTS

Figure 1:
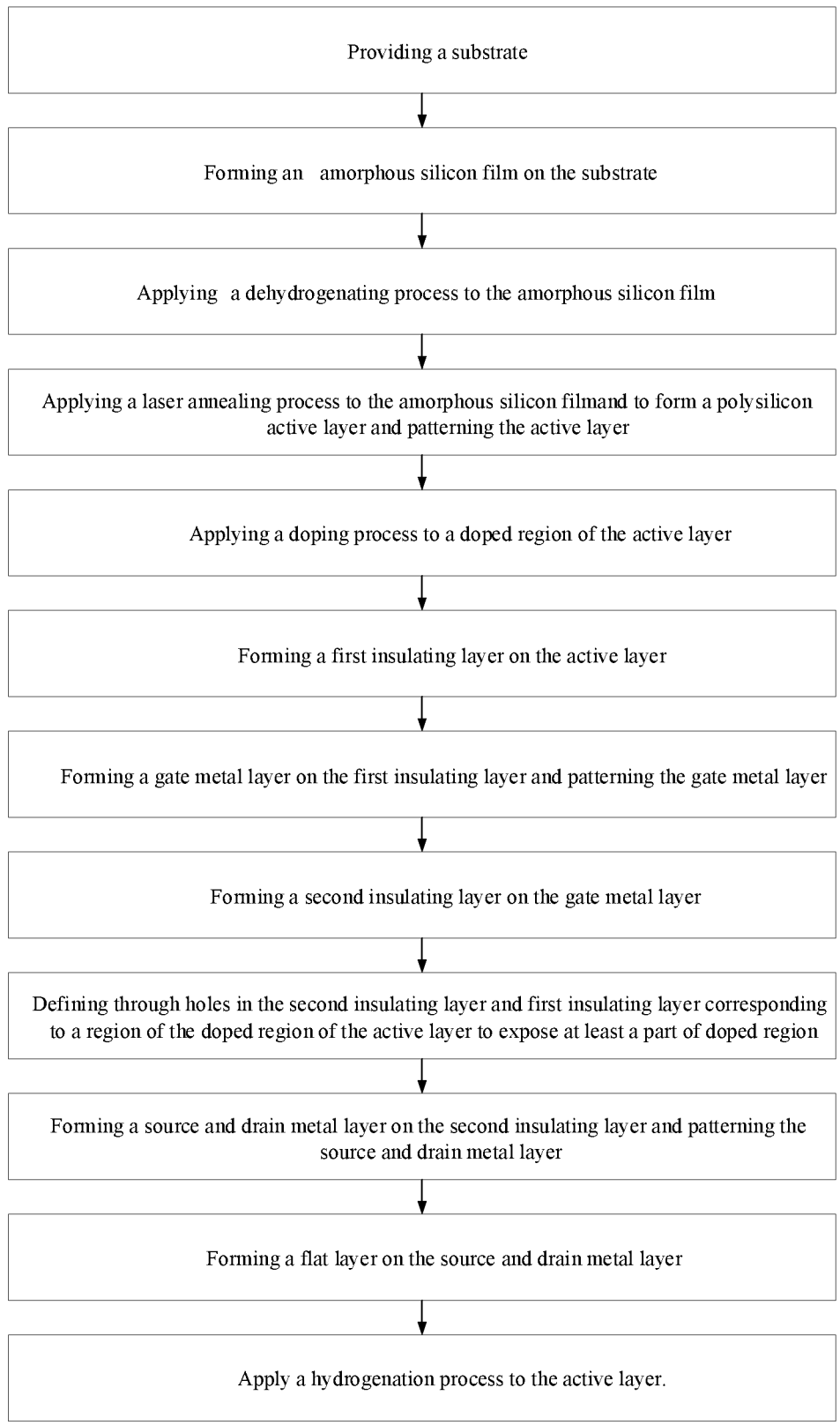
FIG. 1 is a flowchart of a method for manufacturing a thin film transistor of prior art.

Please refer to the drawings in the drawings, in which the same reference numerals represent the same components. The following description is based on the specific embodiments of the present invention as illustrated, and should not be construed as limiting the specific embodiments that are not described herein.

Figure 2:
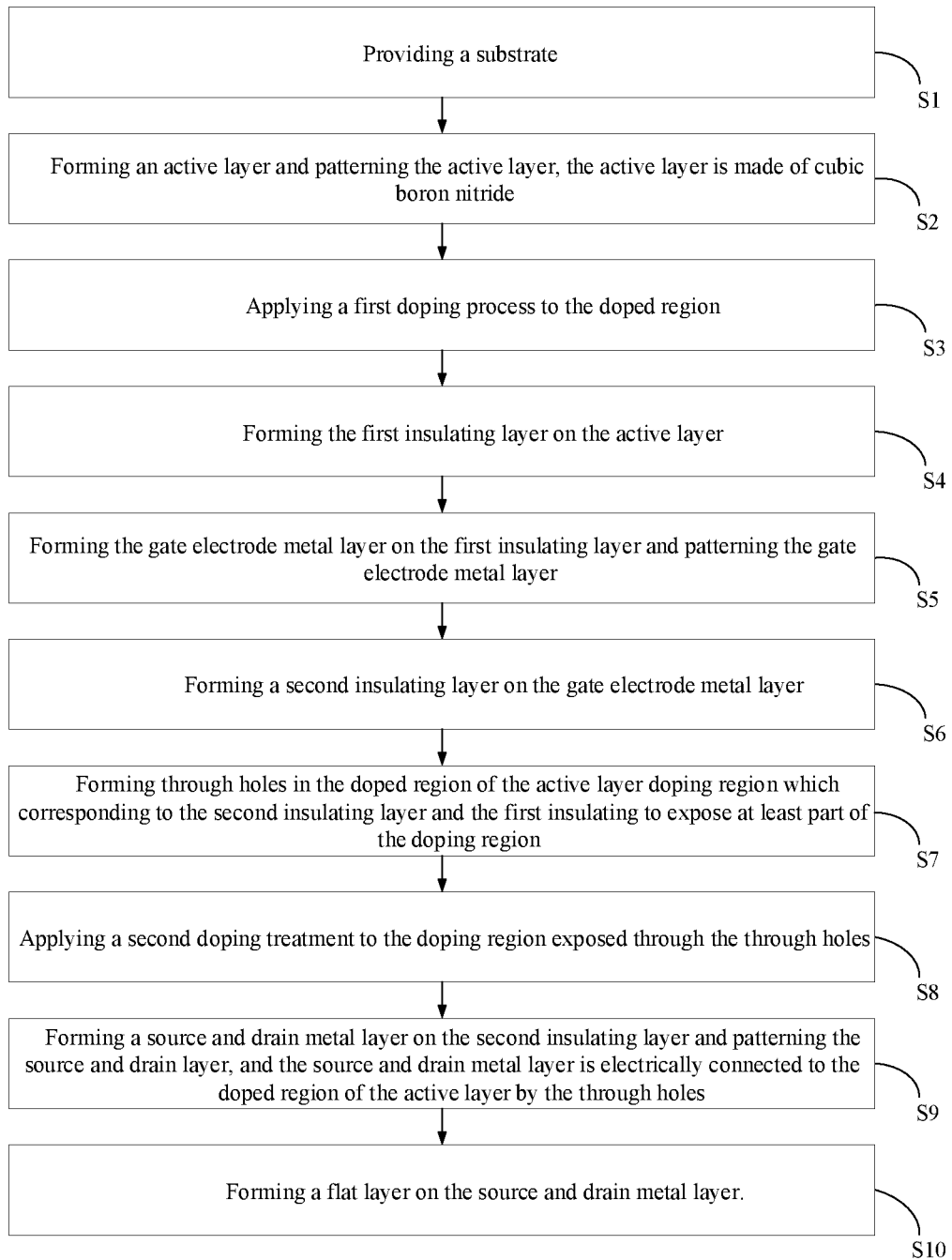
FIG. 2 is a flowchart of a method for manufacturing a thin film transistor of an exemplary embodiment according to the present disclosure.

The present disclosure provides a method for manufacturing a thin film transistor includes:

providing a substrate;

forming an active layer on the substrate and patterning the active layer, wherein the active layer is made of cubic boron nitride;

forming a first insulating layer upon the substrate;

forming a gate electrode metal layer upon the substrate;

forming a second insulating layer upon the substrate; and forming a source and drain metal layer upon the substrate;

Specifically, the present disclosure takes the thin film transistor with a top gate structure as an example to illustrate, but is not limited to this. Referring to FIG. 2, FIG. 2 is a flow chart of a method for manufacturing a thin film transistor of an exemplary embodiment according to the present disclosure. The present disclosure provides a method for manufacturing a thin film transistor includes:

providing a substrate;

forming an active layer on the substrate and patterning the active layer, wherein the active layer is made of cubic boron nitride;

forming a first insulating layer on the active layer;

forming a gate electrode metal layer on the first insulating layer and patterning the gate electrode metal layer;

forming a second insulating layer on the gate electrode metal layer;

forming through holes in the second insulating layer and the first insulating layer corresponding to a region of a doping region of the active layer;

forming a source and drain metal layer and patterning the source and drain metal layers, the source and drain metal layer is connected to the doping region of the active layer by through holes; and forming a flat layer on the source and drain metal layer.

Comparing with the manufacturing process of the thin film transistor with polysilicon as the active layer material in prior art, referring to FIG. 1, in the manufacturing process of the thin film transistor of the present disclosure, cubic phase boron nitride as the active layer is applied and replaces polysilicon as active layer in prior art, this is because the cubic phase boron nitride shows a high hole mobility (500 $cm^2\ v^{-1}\ s^{-1}$), while the polysilicon shows a hole mobility of 480 $cm^2\ v^{-1}\ s^{-1}$. And the cubic phase boron nitride has a doped characteristic, the concentration of carrier is controlled by the ion implantation, so chemical vapor deposition (CVD) process can be applied directly to form the active layer with cubic phase boron nitride, to omit the manufacturing process of dehydrogenating the amorphous silicon film, to apply the laser annealing of amorphous silicon film, and to form polysilicon active layer and hydrogenating the whole thin film transistor.

In addition, cubic phase boron nitride shows a wider forbidden band width (6.4 eV) than polysilicon, which makes the thin film transistor shows a smaller leakage current when cubic phase boron nitride is applied as channel; moreover, it has double doped characteristics, so that a wider space charge region can be formed among the MOS tube source, drain and channel by p-type or n-type doping, further reducing the leakage current.

In the method for manufacturing the thin film transistor of the present disclosure, the manufacturing method of the present thin film transistor is described in detail as below.

In the method for manufacturing the thin film transistor of the present disclosure, step of S1 is that: providing a substrate. The substrate includes a base and a barrier layer and a buffer layer arranged on the base successively.

In the method for manufacturing thin film transistor of the present disclosure, step of S2 is that: forming an active layer and patterning the active layer, the active layer is made of cubic boron nitride. And, the active layer is directly formed on the substrate by a chemical vapor deposition method, vapor for forming the active layer comprise boron chloride ($BCl_3$), boron hydride($B_2H_4$), and ammonia($NH_3$).

Figure 3:
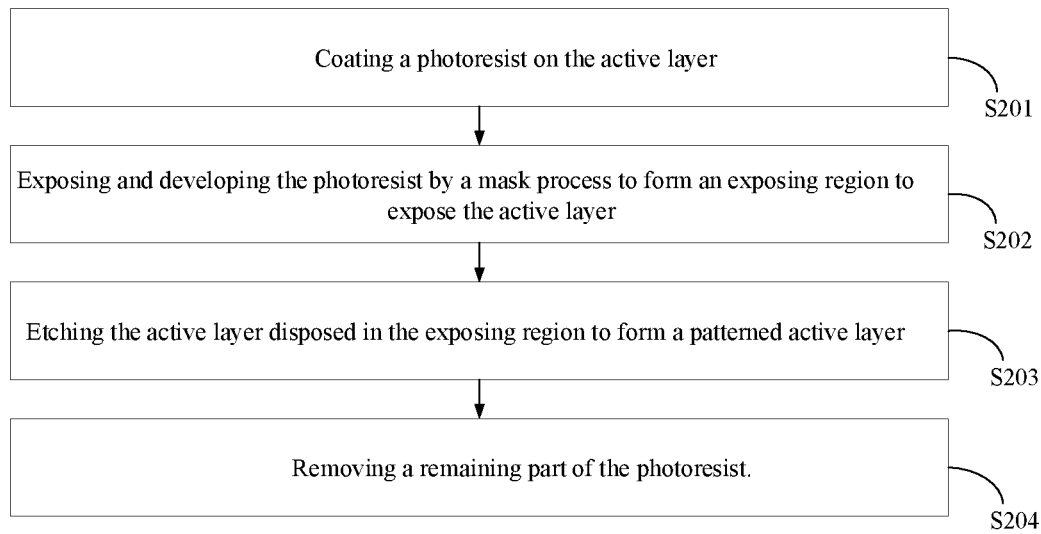
FIG. 3 is a flowchart of a step of S2 of a method for manufacturing a thin film transistor of an exemplary embodiment according to the present disclosure.

Referring to FIG. 3, the step of S2 includes:

a step of 201 is that: coating a photoresist on the active layer;

a step of 202 is that: exposing and developing the photoresist by a mask process to form an exposing region to expose the active layer;

a step of 203 is that: etching the active layer disposed in the exposing region to form a patterned active layer; and a step of 204 is that: removing a remaining part of the photoresist.

Thus, a patterned active layer with cubic boron nitride is formed.

In the method for manufacturing the thin film transistor of the present disclosure, the patterned active layer includes a channel region and a doped region disposed at two sides of the channel region, the method for manufacturing the thin film transistor includes applying a doping process to the active layer, a step of S3 is that: applying a first doping process to the doped region.

When the doping region is an N type doping region, and a doping element of the doping region is made of a material selected from the group consisting of phosphorus, arsenic, and antimony. When the doping region is a P type doping region, and a doping element of the doping region is made of a material selected from the group consisting of boron and indium. Wherein, the doping process is an ion implantation process.

In the method for manufacturing the thin film transistor of the present disclosure, a step of S4 is that: forming the first insulating layer on the active layer. The first insulating layer is prepared by rotary coating and chemical vapor deposition.

In the method for manufacturing the thin film transistor of the present disclosure, a step of S5 is that: forming the gate electrode metal layer on the first insulating layer and patterning the gate electrode metal layer. The gate electrode metal layer is formed on the insulating layer by employing a chemical vapor deposition or sputtering method In the method for manufacturing the thin film transistor of the present disclosure, a step of S6 is that: forming a second insulating layer on the gate electrode metal layer.

In the method for manufacturing the thin film transistor of the present disclosure, a step of S7 is that: forming through holes in the doped region of the active layer doping region which corresponding to the second insulating layer and the first insulating to expose at least part of the doping region. The through holes is defined through the first insulating layer and the second insulating layer.

In the method for manufacturing the thin film transistor of the present disclosure, a step of S8 is that: applying a second doping treatment to the doping region exposed through the through holes. A doping amount of an element of the second doping treatment is less than one third of a doping amount of an element of the first doping treatment.

The method for manufacturing thin film transistor of embodiment of the present disclosure adopts a two steps doping technology, in a first step, a large amount of doped elements is applied to the doping region, and in a second step, a small amount of doped elements is applied to the doping region.

In the method for manufacturing the thin film transistor of the present disclosure, a step of S9 is that: forming a source and drain metal layer on the second insulating layer and patterning the source and drain layer, and the source and drain metal layer is electrically connected to the doped region of the active layer by the through holes.

In the method for manufacturing the thin film transistor of the present disclosure, a step of S10 is that: forming a flat layer on the source and drain metal layer.

Thus, the process of the method for manufacturing the thin film transistor of the present disclosure finishes.

Figure 4:
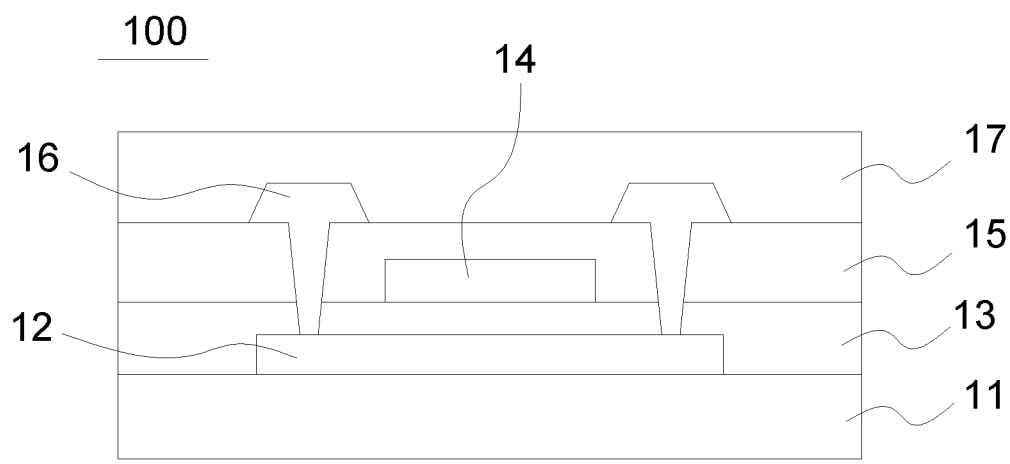
FIG. 4 is a schematic view of a thin film transistor of an exemplary embodiment according to the present disclosure.

Referring to FIG. 4, FIG. 4 is a schematic view of a thin film transistor of an exemplary embodiment according to the present disclosure.

The thin film transistor 100 of the present disclosure includes a substrate 11, an active layer 12, a first insulating layer 13, a gate electrode metal layer 14, a second insulating layer 15, a source and drain metal layer 16, and a flat layer 17.

The active layer 12 is formed on the substrate 11. The first insulating layer 13 is formed on the active layer 12. The gate electrode metal layer 14 is formed on the first insulating layer 13. The second insulating layer 15 is formed on the gate electrode metal layer 14. The a source and drain metal layer 16 is formed on the second insulating layer 15. The flat layer 17 is formed on the source and drain metal layer 16. The active layer 12 is made of cubic boron nitride.

The thin film transistor of the present disclosure, the thin film transistor is a P type thin film transistor or an N type thin film transistor.

Compared with a thin film transistor and a method for manufacturing the thin film transistor of prior art, the method for manufacturing a thin film transistor and the thin film transistor of the present disclosure employ cubic boron nitride instead of polysilicon as active layer materials, CVD process is directly applied to form the active layer with cubic boron nitride to omit the processes of dehydrogenating, annealing, and hydrogenating which are applied in three manufacturing process which are employed in the polysilicon as the active material in prior art to simplify the manufacturing process of a thin film transistor, to improve the production efficiency of the thin film transistor; and to solve the technical problem that the thin film transistor has complex manufacturing process of prior art.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A method for manufacturing a thin film transistor, comprising:
    providing a substrate;
    forming an active layer on the substrate and patterning the active layer, wherein the active layer is made of cubic boron nitride and the patterned active layer comprises a channel region and doped regions disposed at two sides of the channel region;
    applying a doping process to the patterned active layer;
    forming a first insulating layer upon the substrate;
    forming a gate electrode metal layer upon the substrate;
    forming a second insulating layer upon the substrate; and
    forming a source and drain metal layer upon the substrate;
    wherein during the step of forming an active layer on the substrate, the active layer is formed by a chemical vapor deposition method, vapor for forming the active layer comprise boron chloride, boron hydride, and ammonia;
    wherein the step of forming the active layer on the substrate comprises:
    coating a photoresist on the active layer;
    exposing and developing the photoresist by a mask process to form an exposing region to expose the active layer;
    etching the active layer disposed in the exposing region to form a patterned active layer; and
    removing a remaining part of the photoresist;
    wherein the step of applying the doping process to the patterned active layer comprises:
    applying a first doping treatment to the doping regions;
    forming the first insulating layer on the patterned active layer;
    forming through holes in the first insulating layer corresponding to the doping regions to expose at least a part of the doping regions; and
    applying a second doping treatment to the doping regions exposed by the through holes, wherein a doping amount of an element of the second doping treatment is less than one third of a doping amount of an element of the first doping treatment.

2. The method for manufacturing the thin film transistor of claim 1, wherein the doping region is an N type doping region, and a doping element of the doping region is made of a material selected from the group consisting of phosphorus, arsenic, and antimony.

3. The method for manufacturing the thin film transistor of claim 1, wherein the doping region is a P type doping region, and a doping element of the doping region is made of a material selected from the group consisting of boron and indium.

4. The method for manufacturing the thin film transistor of claim 1, wherein the doping process is an ion implantation process.

5. The method for manufacturing the thin film transistor of claim 1, wherein the source and drain metal layer is electrically connected to the doping region by the through holes.

6. A method for manufacturing a thin film transistor, comprising:
    providing a substrate;
    forming an active layer on the substrate and patterning the active layer, wherein the active layer is made of cubic boron nitride and the patterned active layer comprises a channel region and doped regions disposed at two sides of the channel region;
    applying a doping process to the patterned active layer;
    forming a first insulating layer upon the substrate;
    forming a gate electrode metal layer upon the substrate;
    forming a second insulating layer upon the substrate; and
    forming a source and drain metal layer upon the substrate;
    wherein the step of applying the doping process to the patterned active layer comprises:
    applying a first doping treatment to the doping regions;
    forming the first insulating layer on the patterned active layer;
    forming through holes in the first insulating layer corresponding to the doping regions to expose at least a part of the doping regions; and
    applying a second doping treatment to the doping regions exposed by the through holes, wherein a doping amount of an element of the second doping treatment is less than one third of a doping amount of an element of the first doping treatment.

7. The method for manufacturing the thin film transistor of claim 6, wherein during the step of forming an active layer on the substrate, the active layer is formed by a chemical vapor deposition method, vapor for forming the active layer comprise boron chloride, boron hydride, and ammonia.

8. The method for manufacturing the thin film transistor of claim 6, wherein the step of forming the active layer on the substrate comprises:
    coating a photoresist on the active layer;
    exposing and developing the photoresist by a mask process to form an exposing region to expose the active layer;
    etching the active layer disposed in the exposing region to form a patterned active layer; and
    removing a remaining part of the photoresist.

9. The method for manufacturing the thin film transistor of claim 6, wherein the doping region is an N type doping region, and a doping element of the doping region is made of a material selected from the group consisting of phosphorus, arsenic, and antimony.

10. The method for manufacturing the thin film transistor of claim 6, wherein the doping region is a P type doping region, and a doping element of the doping region is made of a material selected from the group consisting of boron and indium.

11. The method for manufacturing the thin film transistor of claim 6, wherein the doping process is an ion implantation process.

12. The method for manufacturing the thin film transistor of claim 6, wherein the source and drain metal layer is electrically connected to the doping region by the through holes.

* * * * *